United States Patent

Blain

[11] Patent Number: 6,111,736
[45] Date of Patent: Aug. 29, 2000

[54] STATIC RELAY WITH CONDITION DETECTING

[75] Inventor: Gérard Jean Blain, Chabeuil, France

[73] Assignee: Crouzet Aotomatismes, Valence, France

[21] Appl. No.: 09/147,153

[22] PCT Filed: Apr. 18, 1997

[86] PCT No.: PCT/FR97/00705

§ 371 Date: Oct. 20, 1998

§ 102(e) Date: Oct. 20, 1998

[87] PCT Pub. No.: WO97/40578

PCT Pub. Date: Oct. 30, 1997

[30] Foreign Application Priority Data

Apr. 22, 1996 [FR] France ................................ 96 05016

[51] Int. Cl.[7] .................................................. H02H 3/14
[52] U.S. Cl. ........................................... 361/88; 324/765
[58] Field of Search .............................. 361/88, 115, 78, 361/91.4; 324/422, 424, 753, 765, 158.1; 340/638, 641, 644, 652, 654

[56] References Cited

U.S. PATENT DOCUMENTS 4,554,507  11/1985  Brown ...................................... 324/767
4,757,417   7/1988  Futsuhara ................................. 361/86
4,929,932   5/1990  Shipkowski ............................... 361/97
5,337,206   8/1994  Kadah et al. ............................. 361/85
5,493,101   2/1996  Innes ....................................... 219/502

FOREIGN PATENT DOCUMENTS 0-348-637   1/1990  European Pat. Off. .......... G08B 5/36
0-511-028  10/1992  European Pat. Off. ....... G05D 19/01
33-11-426  10/1984  Germany ....................... H02H 7/127

Primary Examiner—Ronald W. Leja
Attorney, Agent, or Firm—Oblon, Spivak, McClelland, Maier & Neustadt, P.C.

[57] ABSTRACT

A static relay with semiconductors for insertion into AC electric circuits. The relay includes devices for determining when the state of the relay is in the operating phase and in additional states corresponding to the relay destroyed, the electric circuit deenergized and the relay disconnected from the electric circuit. These devices are wired to the terminals of the relay. The device may be used for determining the opening and closing of electric circuits operating in an AC mode.

20 Claims, 4 Drawing Sheets

STATIC RELAY WITH CONDITION DETECTING

BACKGROUND OF THE INVENTION

1. Field of the Invention

The invention relates to static relays used for opening and closing electric circuits.

2. Discussion of the Background

There are at present at least two main types of relays depending on their technology of construction, electromechanical relays and semiconductor-based relays or static relays. Relays of the electromechanical type comprise one or more electric contacts coupled mechanically to a movable element of a magnetic circuit actuated by controlling the supply to a coil which produces an induction flux in the magnetic circuit. The magnetic circuit is open or closed depending on the position of its movable element. For example, the relay is in the quiescent position, the coil of the relay is not supplied, the magnetic circuit of the coil of the relay is open and the electric contacts of the relay are open. The change of state of the relay is effected by supplying the coil of the relay with an electric control current, the magnetic circuit closes, causing the closure of the electric contacts. The relay goes from a quiescent position to a working position.

The state of the electromechanical relay can be determined rapidly, either by viewing the air gap, between a fixed part and the movable element of the magnetic circuit, or by the switching noise of the relay after a change of state, assuming that the initial state was known.

Unlike electromechanical relays, static relays do not use movable mechanical elements but semiconductors capable of opening or closing an electric circuit in which they are inserted. Generally, for safety reasons the control circuit is galvanically isolated from the electric circuit in which the relay is inserted, certain electric circuits employing high voltages and currents. For example, in the case of static relays the isolating of the control is carried out by a photocoupler. The static relays wired to an electric circuit operating in A.C. mode use semiconductors such as triacs or thyristors mounted in parallel head-to-tail, or analogous components such as those marketed under the names "Snubberless" or "alternistor" which operate like triacs and are better at withstanding untimely triggerings.

These types of semiconductors exhibit, during normal operation, two different states when they are inserted into an electric circuit. An open state and a closed state. In the open state, all of the voltage of the electric circuit is applied to the terminals of the semiconductor. In the closed (or saturated) state, a saturation voltage of around 1.5 volts A.C. appears at the terminals of the semiconductor.

Static relays may exhibit another additional state which is not a customary operating state and which is related to the destruction of the semiconductor, then either being short-circuited or placed in open circuit. When the semiconductor is destroyed and behaves as short-circuited, the voltage at its terminals is virtually equal to 0 volts and when it behaves as an open circuit, the whole of the voltage of the electric circuit is present at its terminals.

Automatic controllers very commonly use relays and particularly static relays which are tending to replace old-technology electromechanical relays and it is necessary to know the actual state of the relay as a function of the state of its control. Currently, two cases may arise, either the relay provides no information about its state, or its state is determined with the aid of systems external to the relay.

For example, making the assumption that the relay is not defective or faulty, a measurement of the current of the electric circuit in which the relay is inserted makes it possible to determine whether the relay is open or closed, this requiring a measurement device which can carry the entire current of the electric circuit. This measurement device is expensive and bulky in particular in the case of electric circuits involving large power levels. In the case of semiconductor-based static relays, the voltage at the terminals of the relay can be measured so as to determine the state thereof. When the relay is open the whole of the voltage of the electric circuit is applied to its terminals and when it is closed it should be possible to detect a voltage of the order of 1.5 volts corresponding to the saturation voltage of the semiconductor. The device for measuring the voltage at the terminals of the relay must on the one hand carry the voltages of the electric circuits which may sometimes be as high as a few hundred or even a few thousand volts and on the other hand have sufficient accuracy to detect the low saturation voltage of the semiconductor of around 1.5 volts. This leads to a measurement rig which is overly expensive and difficult to implement.

SUMMARY OF THE INVENTION

To alleviate these drawbacks of the prior art the invention proposes a static relay (RS) which is intended to be inserted into an A.C. electric circuit (CE) comprising at least two connection terminals (1, 2), the static relay (RS) having at least one semiconductor component able to take two states during the operating phase, one open and the other closed, means for determining the state of the relay (RS) during the operating phase and an additional state corresponding in particular to the relay destroyed, to the electric circuit (CE) de-energized, to the relay disconnected, these means being wired to the terminals of the relay, characterized in that the means for determining the state of the relay comprise a pair of light-emitting diodes (D1, D2) mounted in parallel head-to-tail, this pair being in series with a circuit of the series RC type (R1, C), the assembly of the diodes (D1, D2) and the RC circuit (R1, C) being wired in parallel with the semi-conductor component (Th1, Th2) and each diode (D1, D2) being optically coupled respectively to a transistor (T1, T2), one of the diodes being traversed by a current related to the positive half-cycle of the A.C. voltage of the electric circuit and the other diode being traversed by a current related to the negative half-cycle of the same electric circuit. The light-emitting diodes are lit for almost the entirety of the half-cycles when the component is open and non-defective. These same diodes are lit for a short instant when the half-cycles pass through the zero level with the component being closed and non-defective.

The diodes remain unlit during the entirety of the half-cycles when the component is defective and short-circuited.

BRIEF DESCRIPTION OF THE DRAWINGS

Other characteristics and advantages of the invention will emerge on reading the description of examples of a relay according to the invention in which.

DETAILED DESCRIPTION OF THE PREFERRED EMBODIMENTS

In the graphs, the scales are not necessarily complied with, for the sake of clarity.

Figure 1A:
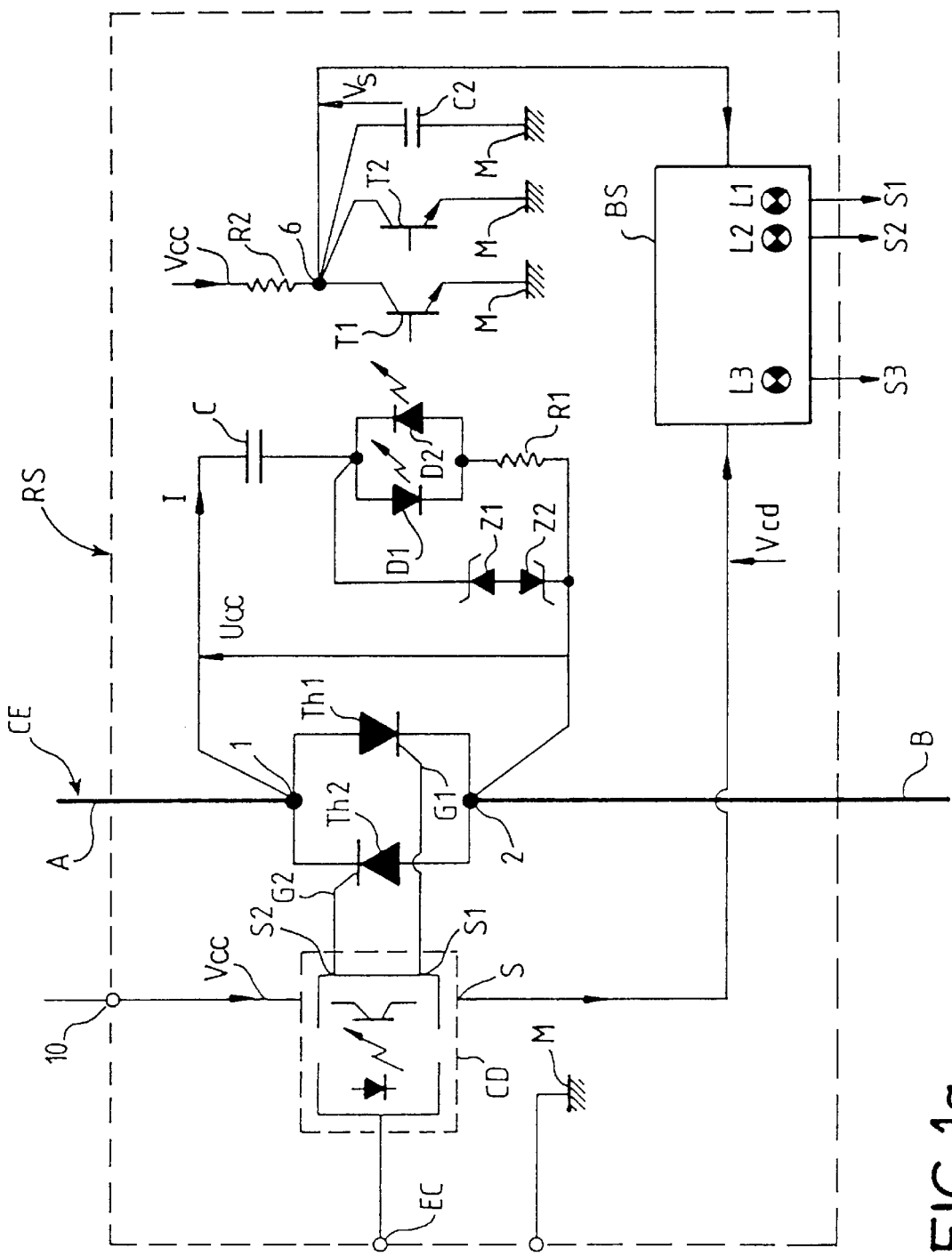
FIG. 1a represents the electric diagram of the static relay according to the invention and FIG. 1b a variant of the semiconductor of the relay.

FIG. 1a shows the electric diagram of an illustrative embodiment of a static relay RS according to the invention, comprising a pair of thyristors Th1 and Th2 wired in parallel head-to-tail. The cathode of the thyristor Th2 is wired to the anode of the thyristor Th1 and to a terminal 1 of the relay RS, this terminal being itself wired to a first side A of an electric circuit CE and the cathode of the thyristor Th1 is wired to the anode of the thyristor Th2 and to a terminal 2 of the relay RS, this terminal itself being wired to a second side B of the electric circuit CE. The voltage appearing at the terminals of the thyristors when the electric circuit CE is energized will be denoted subsequently by Ucc.

The relay RS is controlled by a control input EC of a control circuit CD which sends, according to the known art, via its control outputs S1 and S2 to the respective gates G1 and G2 of the thyristors Th1 and Th2, electrical signals which trigger the closure of these thyristors. The control circuit CD builds in optical isolation so as to isolate the input EC of the relay, from the thyristors which are at the voltage of the electric circuit CE.

The means for determining the state of the relay comprise a pair of light-emitting diodes D1, D2 mounted in parallel head-to-tail, this pair of diodes being in series with a circuit of the series RC type R1, C, the assembly of the pair of diodes D1, D2 and the RC circuit being wired in parallel with the pair of thyristors Th1, Th2 and each diode D1, D2 being optically coupled respectively to a transistor T1, T2.

The relay RS includes an input 10 connected to a supply source external to the relay, of supply voltage Vcc making it possible to supply direct current on the one hand to the relay control circuit CD and on the other hand to the means for determining the state of the relay RS.

The collectors of the transistors T1 and T2 are wired together on a terminal 6 and linked on the one hand to the supply voltage Vcc by way of a resistor R2 and on the other hand to a common earth M by way of a capacitor C2.

The emitters of the transistors T1 and T2 are wired to the common earth M.

The information about the state of the relay RS is obtained via the voltage Vs at the output of the collectors of the transistors T1 and T2 (terminal 6).

It is preferable to place a voltage limiter, which in this illustrative embodiment comprises two Zener diodes Z1 and Z2 mounted in series head-to-tail, at the terminals of the sub-assembly consisting of the pair of light-emitting diodes D1 and D2 and the resistor R1. This limiter Z1, Z2 makes it possible to protect the light-emitting diodes D1 and D2 in the event of a large-amplitude steep edge of the voltage Ucc at the terminals of the thyristors, for example due to the triggering of the thyristors when the voltage Ucc is at high level.

The operation of the relay RS will now be described. The relay RS is inserted into an electric circuit CE which is assumed to be operating at an A.C. electric voltage U which is for example sinusoidal. The case is considered in which the relay is in the open position, that is to say the thyristors Th1 and Th2 are open.

In order to explain the mode of operation, reference is made to FIGS. 1a, 2a, 2b and 2c which represent the electric diagram of the relay inserted into the electric circuit CE and the voltage and current graphs in the circuits of the relay RS.

Figure 2A:
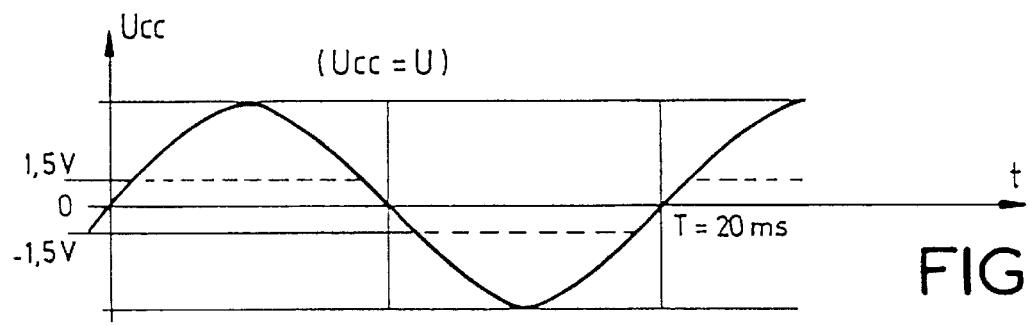
FIGS. 2a, 2b and 2c represent the voltage and current graphs of the relay which is the subject of FIG. 1 in the open state.

The relay RS being set to the open position by the control EC, the whole of the voltage U of the electric circuit is applied to the terminals of the thyristors (terminals 1 and 2 of the relay RS) and in this case Ucc is equal to the voltage U of the electric circuit CE. The graph of FIG. 2a shows the voltage Ucc as a function of time at the terminals of the thyristors.

Considering an electric circuit operating in A.C. mode at a frequency of 50 Hz, the period T of the voltage Ucc will be 20 ms.

Figure 2B:
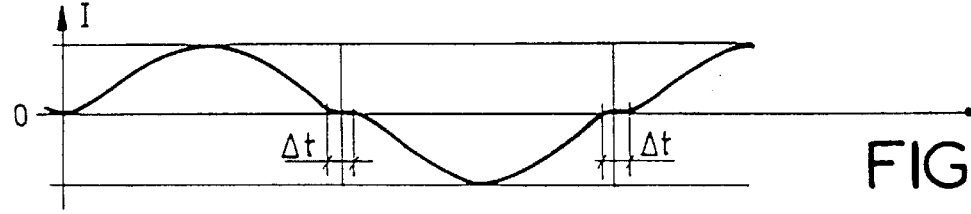

The graph of FIG. 2b shows the shape of the current I in the circuit consisting of the capacitor C, the light-emitting diode D1 and D2 and the resistor R1.

The current I has almost the shape of a sinusoidal current. The current I passes through the light-emitting diodes D1 during one half-cycle and the light-emitting diode D2 during the other half-cycle alternately producing the saturation of the transistor T1 and then of the transistor T2 and so on, except during a short period of time $\Delta t$ relative to the period of the voltage Ucc corresponding to the vanishing of the current I in the diodes D1 and D2, due to the conduction threshold (of around 1.2 volts) of the diodes D1 and D2, at the moment at which the voltage Ucc passes through 0 volts.

Figure 2C:
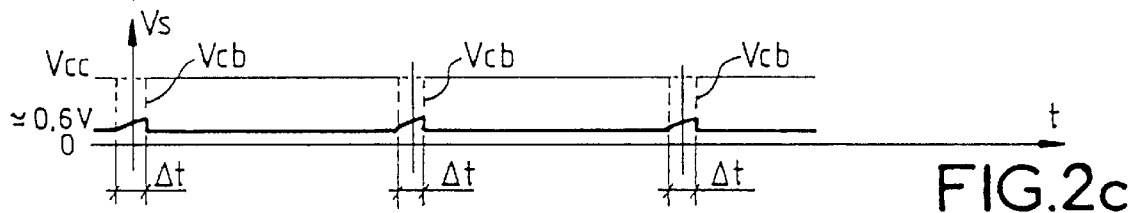

For around this short spell of time $\Delta t$, the transistors T1 and T2 are disabled and the voltage Vs at the terminals of its collectors, represented dashed in FIG. 2c, tends to pass abruptly, for the time $\Delta t$, to the level of the supply voltage Vcc. FIG. 2c represents dashed a voltage Vcb which appears on the collectors of the transistors T1, T2, for $\Delta t$, in the case in which a capacitor C2 is not wired to the collectors of the transistors. The RC type circuit R2, C2 is responsible for integrating the variations of the voltage Vcb during the time spell $\Delta t$.

The values of R2 and C2 are calculated so as to hold this variation in Vcb to a low value, close to the saturation voltage of the transistors. The voltage Vs at the terminal 6, the point of connection of the collectors of the two transistors T1 and T2, is held substantially equal to the saturation voltage of the transistors, i.e. around 0.6 volts. The voltage Vs will be said to be at a low state.

The RC type circuit consisting of the components C and R1 is dimensioned in such a way as to provide a current I which is sufficient to saturate the transistors T1 and T2.

In this illustrative embodiment, the capacitor C is around 10 nF and the resistor R1 around 47 Ω.

The relay is set to the closed (or saturated) position, and reference is made to FIGS. 1a, 3a, 3b and 3c to explain this phase of operation.

The closing of the relay RS by controlling its input EC causes the closing of the electric circuit CE. The alternating current flowing through the electric circuit causes a saturation voltage to appear at the terminals of the thyristors Th1 and Th2, this voltage being of the order of 1.5 volts for this type of semiconductor.

Figure 3A:
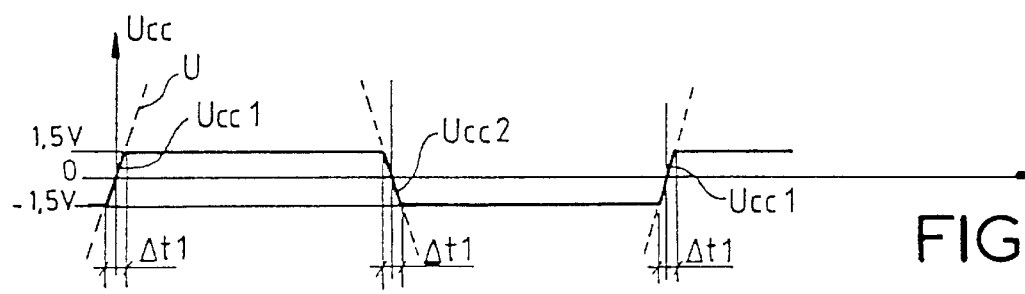
FIGS. 3a, 3b, 3c represent the voltage and current graphs of the relay which is the subject of FIG. 1a in the closed state.

The graph of FIG. 3a shows the shape of the voltage Ucc at the terminals of the thyristors (terminals 1 and 2).

In a first phase, the voltage Ucc follows the sinusoidal voltage U of the electric circuit, this voltage being represented partially dashed in FIG. 3a, and it stabilizes about the value of the saturation voltage of the thyristors. During the positive half-period Th1 is closed and the voltage Ucc between the terminals 1 and 2 is of the order of 1.5 volts and during the other negative half-period, the other thyristor Th2 is closed and the voltage Ucc is of the order of −1.5 volts.

The current I in the capacitor C is related to the variation in the voltage at the terminals of the RC circuit comprising the capacitor C, the diodes D1 and D2 and the resistor R1, i.e. to $$\frac{dUcc}{dt}.$$

The current I appears in pulsatile form during the rising or falling edges of the voltage Ucc about 0 volts and for a time $\Delta t1$, which is short relative to the period and depends on the value of the voltage in the electric circuit (dashed curve in FIG. 3a) relative to the saturation voltage of the thyristors.

Figure 3B:
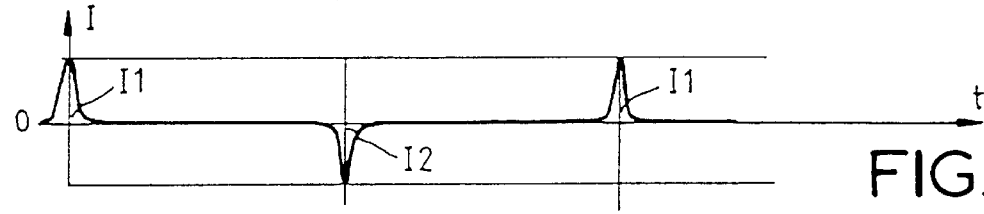
Figure 3C:
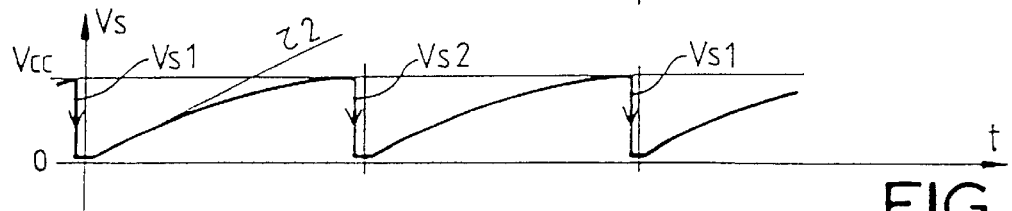

FIG. 3b shows the pulsatile current I in the capacitor C, the current pulse I1 occurring during the rising edge Ucc1 of the voltage Ucc, passes through the diode D1 causing saturation, for around $\Delta t1$, of the transistor T1 optically coupled to the diode D1 and instantaneously discharging of the capacitor C2 mounted between the collectors of the transistors T1 and T2 and the earth M. This is manifested by a steep falling edge Vs1 (FIG. 3c) of the voltage Vs of the collectors of the transistors T1 and T2 and then the charging of the capacitor C2, to the supply voltage Vcc applied to the resistor R2, with a time constant $\tau_2=R2\times C2$.

For example, in this embodiment the resistor R2 is around 33 KΩ and the capacitor C2 is around 200 nF. The power time constant $\tau_2$ is around 7.26 ms.

In the same way, during the falling edge Ucc2 (FIG. 3a) of the voltage Ucc which occurs at the following half-period around a voltage Ucc of 0 volts, the pulsatile current I2 passes through the other light-emitting diode D2, causing saturation, for a time of around $\Delta t1$, of the transistor T2 optically coupled to the light-emitting diode D2 and in the same way as for the previous half-period an instantaneous discharging of the capacitor C2 manifested as a steep falling edge Vs2 of the voltage Vs of the collectors of the transistors T1 and T2 and then a new charging of the capacitor C2 to the voltage Vcc applied to the resistor R2.

The open state of the relay RS is determined by a succession of falling edges (Vs1, Vs2 . . . ) of the voltage Vs every half-period, i.e. for an A.C. circuit operating at 50 Hz, every 10 ms.

The case will be considered in which the state detecting means indicate the additional state. This occurs in particular when one or both thyristors are destroyed or when the electric circuit is de-energized or even when the relay is disconnected.

In the cases which follow, reference will be made to the relay of FIG. 1a to explain the mode of operation.

Figure 4A:
FIGS. 4a and 4b represent the voltage and current graphs of the relay which is the subject of FIG. 1a in the additional state, when the semiconductor is short-circuited.
Figure 4B:
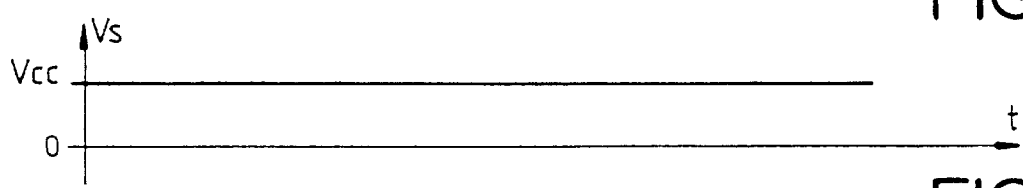

In the cases in which both thyristors are destroyed and short-circuited or when the electric circuit is de-energized or even when the relay is disconnected only from the electric circuit CE (terminals 1 and 2), the voltage Ucc at the terminals of the thyristors, represented in FIG. 4a, is substantially equal to 0 volts. The transistors T1 and T2 are disabled on account of the absence of current I (represented in FIG. 4a) in the light-emitting diodes D1 and D2, the collectors of the transistors T1 and T2 are disabled and the output voltage Vs, represented in FIG. 4b, is at the supply voltage Vcc, i.e. in the high state.

Figure 5A:
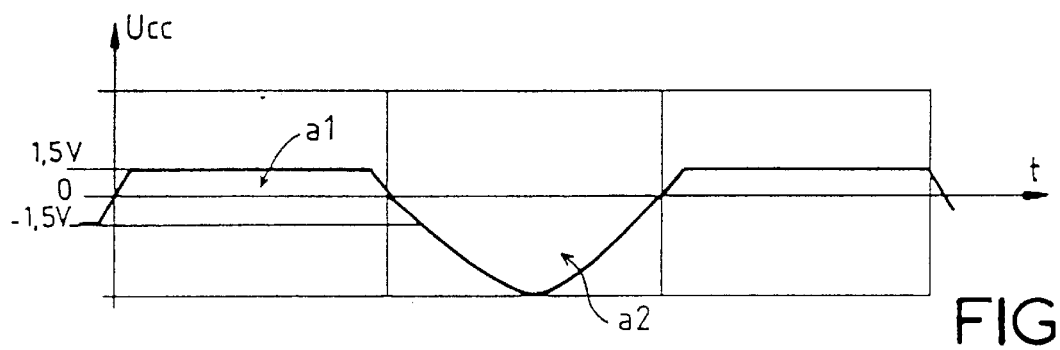
FIGS. 5a, 5b and 5c represent the voltage and current graphs of the relay which is the subject of FIG. 1a in another additional state, the relay being in the closed position.
Figure 5B:
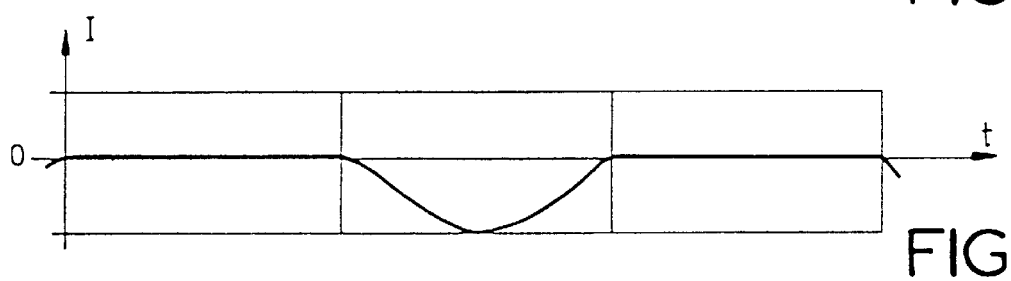
Figure 5C:
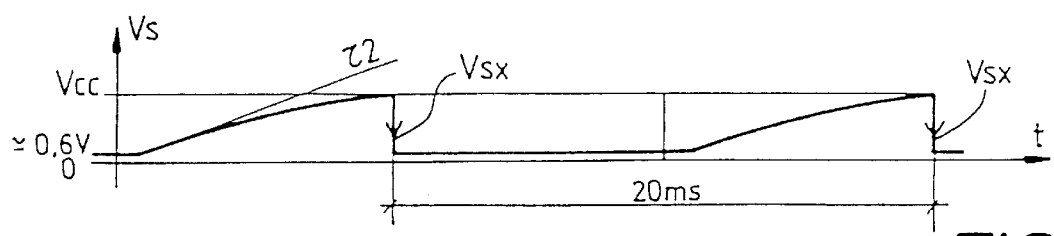

In another case, the relay RS, controlled by its input EC, is in a closed state and one of the thyristors, for example the thyristor Th2, is destroyed and open-circuited. During a first half-cycle a1 of the voltage Ucc, the thyristor Th1 is closed and allows the current of the electric circuit CE to flow. The voltage Ucc, represented in FIG. 5a, is of the order of 1.5 volts corresponding to the saturation voltage of the thyristor Th1. The current I, represented in FIG. 5b, in the circuit comprising the pair of diodes D1, D2 is zero during this first half-cycle a1. The transistors T1 and T2 are disabled and the voltage Vs, represented in FIG. 5c, which was at a low state, during the previous half-cycle, as will be shown subsequently, goes from 0 volts to the supply voltage Vcc, as in the case of FIG. 3c, with the time constant $\tau_2$ (resistor R2, capacitor C2).

During the following half-cycle a2, the voltage Ucc changes direction and the thyristor Th1, which was closed during the previous half-cycle a1, becomes open under normal operation and the whole of the voltage of the electric circuit CE is applied to the terminals of the thyristors. A current I appears in one of the diodes of the pair of diodes D1, D2 saturating one of the transistors T1, T2 which then brings about the instantaneous discharging of the capacitor C2 and the switching from the level Vcc to the saturation level of the saturated transistor, i.e. around 0.6 volts, of the voltage Vs via a steep edge Vsx. The voltage Vs remains at around 0.6 volts for the whole of the half-cycle a2, i.e. at the low state.

The signal Vs exhibits a steep falling edge Vsx every period. For example, every 20 ms in the case of an electric circuit operating at 50 Hz.

The voltage Vs at the output of the means for determining the state of the relay RS will have the following summary characteristics:

| States of the relay | Voltage Vs |
| --- | --- |
| open | Vs ≈ 0.6 volts (low state) |
| closed | Vs: falling edge Vs1, Vs2 (from Vcc to ≈ 0.6 volts) every half-period |
| Additional: | |
| 1 - Thyristors destroyed and short-circuited or when the electric circuit is de-energized or even when the relay is disconnected only from the electric circuit CE (terminals 1 and 2). | Vs ≈ Vcc (high state) |
| 2 - Relay RS in the closed state, a thyristor destroyed and open-circuited | Vs: falling edge Vsx (from Vcc to ≈ 0.6 volts) every period |

Figure 1B:
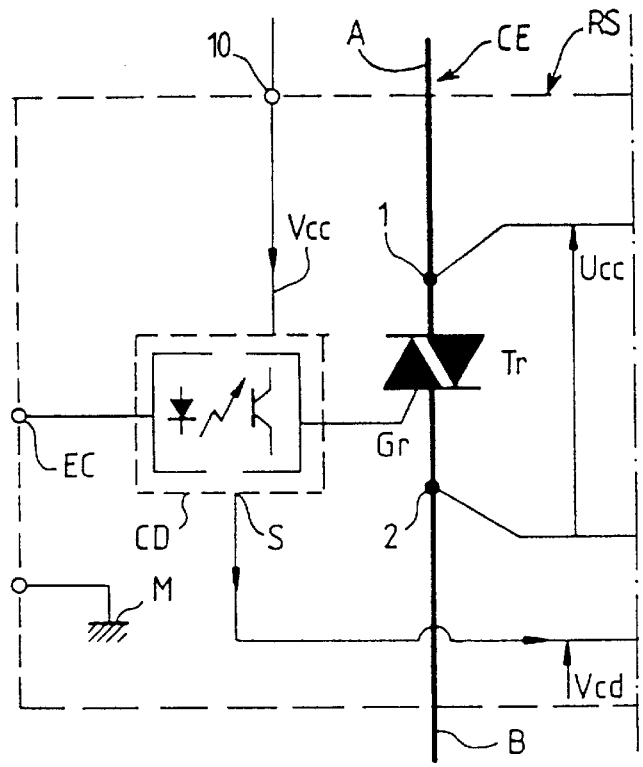
FIG. 1c represents a variant of the means for determining the state of the relay.

In another embodiment of the static relay with detection of state, represented in FIG. 1b, the semiconductor component is a triac Tr. This semiconductor comprises a single gate Gr. The triggering of the triac either during the positive half-cycle or during the negative half-cycle of the A.C. voltage applied to its terminals is performed by a single gate. In this case, the control circuit will, according to the known art, be adapted to this type of semiconductor.

Figure 1C:
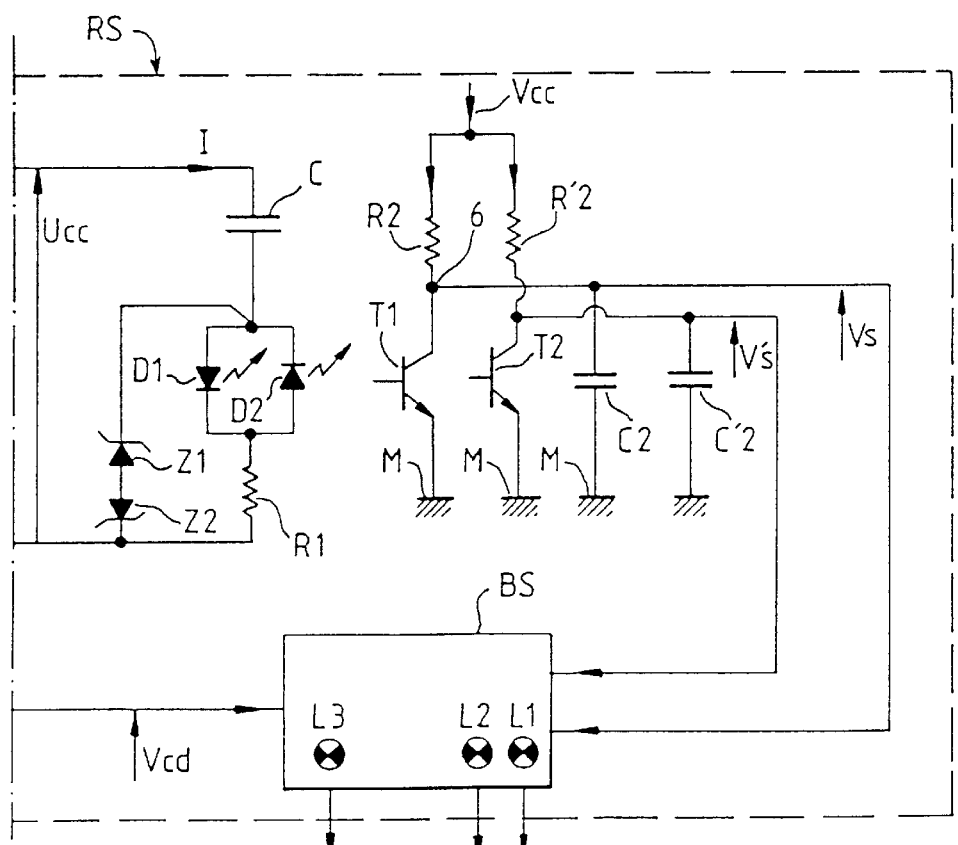

In another embodiment shown in FIG. 1c, the means for determining the state of the relay RS comprise the two transistors T1 and T2, the collector of the transistor T1 is linked on the one hand to the supply voltage Vcc by way of a resistor R2 and on the other hand to the common earth M, by way of a capacitor C2. The collector of the transistor T2 is linked on the one hand to the supply voltage Vcc by way of a resistor R'2 and on the other hand to the common earth M by way of a capacitor C'2, the emitters of the transistors T1, T2 being wired to the common earth M.

Two cues Vs and V's at the respective output of the collectors of the transistors T1 and of T2 respectively represent the state of the relay corresponding to one and to the other of the half-cycles of the electric circuit CE.

The control state corresponding to the voltage Vcd at the output S (FIG. 1a) of the control circuit CD and the various states of the output voltage Vs corresponding to the open, closed or additional states are processed by a known electronic system BS so as to be shaped for example by flip-flops or monostables, which generate separate cues regarding the state of the relay. It is, for example, possible to switch on the light-emitting diodes L1, L2, L3 corresponding to the states of the relay and/or to generate state cues S1, S2, S3 at the output of the system BS for processing by a computer circuit which will be able to take account of other parameters of the relay, such as the state of its control input EC or parameters external to the relay such as for example the presence or the absence of voltage in the electric circuit CE.

The possibilities for processing the signal Vs (and V's in FIG. 1c) at the output of the relay which have been described in this document are not limiting of other processings and combinations with external or relay signals lead to complete determination of the state of the relay or of the state of a set of relays forming part of an automatic system.

What is claimed is:

1. A static relay configured to be inserted into an A.C. electric circuit, comprising:
   at least two connection terminals;
   at least one semiconductor component configured to be in an open state or in a closed state during an operating phase of the static relay;
   a determining circuit configured to determine if the static relay is in the open state or the closed state during the operating phase or if the static relay is in an additional state corresponding at least to the static relay being defective said determining circuit being wired to the at least two connection terminals, wherein the determining circuit comprises,
   a pair of light-emitting diodes connected to each other in a parallel head-to-tail arrangement,
   a series RC circuit, the pair of light-emitting diodes being connected in series with the series RC circuit to form a further circuit wired in parallel with the at least one semiconductor component,
   a pair of transistors with each light-emitting diode being optically coupled to a respective transistor, and
   wherein one of the pair of light-emitting diodes is traversed by a current related to a positive half-cycle of an A.C. voltage of the A.C. electric circuit and the other light-emitting diode is traversed by a current related to a negative half-cycle of the same A.C. voltage of the electric circuit, with the light-emitting diodes being lit for almost the entirety of the respective half-cycles when the static relay is in the open state and non-defective, with the light-emitting diode being lit for a short instant when the respective half-cycles pass through a zero level when the static relay is in the closed state and non-defective, or with the light-emitting diodes remaining unlit during the entirety of at least one of the respective half-cycles when the static relay is defective.

2. The static relay according to claim 1, wherein the at least one semiconductor component includes a thyristor.

3. The static relay according to claim 1, wherein the at least one semiconductor component includes a triac.

4. The static relay according to claim 2, wherein the at least one semiconductor component comprises two thyristors wired in a parallel head-to-tail arrangement relative to the at least two connection terminals.

5. The static relay according to claim 1, wherein the static relay is equipped with a control circuit configured to control the at least one semiconductor component in such a way as to trigger the at least one semiconductor component when a voltage at the at least two connection terminals goes substantially to 0 volts.

6. The static relay according to claim 1, wherein a voltage limiter is connected in parallel with the pair of light-emitting diodes and the resistor of the RC circuit.

7. The static relay according to claim 6, wherein the voltage limiter comprises two zener diodes connected together in a series head-to-tail arrangement.

8. The static relay according to claim 1, wherein collectors of the transistors are wired together and linked to a supply voltage by way of a resistor and to a common earth by way of a capacitor, with emitters of the transistors being wired to the common earth.

9. The static relay according to claim 1, wherein a collector of each of the transistors is linked to a supply voltage by way of a resistor and to a common earth by way of a capacitor, with emitters of the transistors also being wired to the common earth.

10. The static relay according to claim 1, wherein the static relay is equipped with a system which shapes and/or transmits out of the static relay the state information for the static relay.

11. The static relay according to claim 2, wherein the static relay is equipped with a control circuit configured to control the at least one semiconductor component when a voltage at the at least two connection terminals goes substantially to 0 volts.

12. The static relay according to claim 3, wherein the static relay is equipped with a control circuit configured to control the at least one semiconductor component when a voltage at the at least two connection terminals goes substantially to 0 volts.

13. The static relay according to claim 4, wherein the static relay is equipped with a control circuit configured to control the at least one semiconductor component when a voltage at the at least two connection terminals goes substantially to 0 volts.

14. The static relay according to claim 2, wherein a voltage limiter is connected in parallel with the pair of light-emitting diodes and the resistor of the RC circuit.

15. The static relay according to claim 3, wherein a voltage limiter is connected in parallel with the pair of light-emitting diodes and the resistor of the RC circuit.

16. The static relay according to claim 4, wherein a voltage limiter is connected in parallel with the pair of light-emitting diodes and the resistor of the RC circuit.

17. The static relay according to claim 5, wherein a voltage limiter is connected in parallel with the pair of light-emitting diodes and the resistor of the RC circuit.

18. The static relay according to claim 2, wherein collectors of the transistors are wired together and linked to a supply voltage by way of a resistor and to a common earth by way of a capacitor, with emitters of the transistors being wired to the common earth.

19. The static relay according to claim 3, wherein collectors of the transistors are wired together and linked to a supply voltage by way of a resistor and to a common earth by way of a capacitor, with emitters of the transistors being wired to the common earth.

20. The static relay according to claim 4, wherein collectors of the transistors are wired together and linked to a supply voltage by way of a resistor and to a common earth by way of a capacitor, with emitters of the transistors being wired to the common earth.

* * * * *

UNITED STATES PATENT AND TRADEMARK OFFICE
CERTIFICATE OF CORRECTION

PATENT NO. : 6,111,736
DATED : August 29, 2000
INVENTOR(S): Gérard Jean Blain

It is certified that an error appears in the above-identified patent and that said Letters Patent is hereby corrected as shown below:

On the Title Page, Item [73], the Assignee Information is incorrect. The Assignee Information should read as follows:

--[73] Assignee: Crouzet Automatismes, Valence, France --

Signed and Sealed this

Fifteenth Day of May, 2001

Attest:

NICHOLAS P. GODICI

Attesting Officer    Acting Director of the United States Patent and Trademark Office